US010939550B2

(12) United States Patent
Tanielian

(10) Patent No.: US 10,939,550 B2
(45) Date of Patent: Mar. 2, 2021

(54) SYSTEM AND METHOD OF FORMING ELECTRICAL INTERCONNECTS

(71) Applicant: THE BOEING COMPANY, Chicago, IL (US)

(72) Inventor: Minas H. Tanielian, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 674 days.

(21) Appl. No.: 15/014,096

(22) Filed: Feb. 3, 2016

(65) Prior Publication Data

US 2017/0223828 A1 Aug. 3, 2017

(51) Int. Cl.
| | |
|---|---|
| H05K 1/09 | (2006.01) |
| C25D 5/54 | (2006.01) |
| H01B 1/04 | (2006.01) |
| C23C 14/18 | (2006.01) |
| C23C 28/00 | (2006.01) |
| H01B 1/24 | (2006.01) |

(52) U.S. Cl.
CPC ............ *H05K 1/09* (2013.01); *C23C 14/18* (2013.01); *C23C 28/322* (2013.01); *C23C 28/34* (2013.01); *C23C 28/42* (2013.01); *C25D 5/54* (2013.01); *H01B 1/04* (2013.01); *H01B 1/24* (2013.01); *H05K 1/097* (2013.01); *H05K 2201/0245* (2013.01); *H05K 2201/0323* (2013.01); *H05K 2201/0338* (2013.01); *H05K 2201/0379* (2013.01)

(58) Field of Classification Search
CPC ....................................................... H05K 1/09

USPC ......................................................... 174/250
See application file for complete search history.

(56) References Cited

U.S. PATENT DOCUMENTS

| | | | |
|---|---|---|---|
| 2013/0037780 A1* | 2/2013 | Kivioja | G01L 1/2293 257/26 |
| 2015/0062452 A1* | 3/2015 | Shih | G06F 3/044 349/12 |
| 2015/0194241 A1 | 7/2015 | Tanielian | |
| 2015/0371848 A1* | 12/2015 | Zaretski | H01L 21/02527 438/496 |
| 2018/0025679 A1* | 1/2018 | Park | G09F 9/00 345/156 |

OTHER PUBLICATIONS

Su et al., "Hybrid stacking structure of electroplated copper onto graphene for future interconnect applications", Applied Physics Letters, 107, 093105 (2015), IDS filed on Feb. 3, 2016.*
Mansour et al., "Bromination of Graphene, a new route to making high performance transpatent conducting electrodes with low optical losses", ACS Applied materials and Interfaces (Jul. 22, 2015), IDS filed on Feb. 3, 2016.*

(Continued)

*Primary Examiner* — Stanley Tso
(74) *Attorney, Agent, or Firm* — The Small Patent Law Group LLC; Joseph M. Butscher

(57) ABSTRACT

A method of forming a high-conductivity electrical interconnect on a substrate may include forming a graphene film with a plurality of graphene members, depositing a metal over the graphene film, and providing a metallic overlay that connects the plurality of graphene members together through the depositing operation to form a covered graphene film.

23 Claims, 3 Drawing Sheets

(56) References Cited

OTHER PUBLICATIONS

Abstract of "Bromine doping of multilayer graphene for low-resistance interconnects," Ueno, et al., from Jpn. J. Appl. Phys 53 05GC02 (Apr. 22, 2014).
"Bromination of Graphene: A New Route to Making High Performance Transparent Conducting Electrodes with Low Optical Losses," Mansour, et al., ACS Applied Materials and Interfaces (Jul. 22, 2015).
Scalable Graphite/Copper Bishell Composite for High-Performance Interconnects, Yeh, et al., ACSNANO, vol. 9, No. 1 (2014).
"Hybrid stacking structure of electroplated copper onto graphene for future interconnect applications," Su, et al., Applied Physics Letters 107, 093105 (2015).

* cited by examiner

SYSTEM AND METHOD OF FORMING ELECTRICAL INTERCONNECTS

FIELD OF THE DISCLOSURE

Embodiments of the present disclosure generally relate to systems and methods for forming electrical interconnects, and, more particularly, to systems and methods of forming high conductivity electrical interconnects on substrates.

BACKGROUND OF THE DISCLOSURE

In various applications, electrical power, current, and signals are conducted through electrical traces, wires, and/or cables. Known electrical wires or cables include a conductor core and an insulative jacket disposed peripherally about the conductor core. Notably, wires and cables are additional components of a system that add size and weight.

Various electrical circuits include interconnecting lines or traces instead of separate and distinct wires and cables between components. Each interconnect exhibits a resistance, which may limit the performance of a particular circuit. For example, the resistance of an interconnecting trace may delay signal transmission between components of the circuit. Additionally, heat generated by interconnects is a function of the resistance of the interconnects. That is, with increased resistance, increased heat is generated.

Known processes for forming interconnects are generally limited by the intrinsic conductivity of the interconnection materials, such as aluminum or copper traces. Another known alternative for forming interconnects includes a graphite doping process. Highly oriented pyrolytic graphite, when suitably doped, may lead to "super-metallic" conductivities, such as electrical conductivities that exceed that of copper by a factor of 5 or more along the graphitic x-y planes. The graphite doping process takes place via intercalation. During intercalation, a dopant species penetrates the graphite layers and chemically bonds to the graphite. However, the graphite may be susceptible to imperfections, such as cracks, lattice defects, or other breaks, which may reduce the conductivity thereof. As such, doping such an imperfect graphite component does not provide a reliable way to form a conductive interconnect.

SUMMARY OF THE DISCLOSURE

Accordingly, a need exists for a system and method of efficiently and effectively forming a highly-conductive structure. A need exists for an interconnect that provides increased conductivity.

With those needs in mind, certain embodiments of the present disclosure provide a high-conductivity electrical interconnect that is configured to electrically interconnect electrical components. The high-conductivity electrical interconnect may include a plurality of graphene members, and a metallic overlay connecting the plurality of graphene members together.

The metallic overlay may connect peripheral edges of the plurality of graphene members together. The metallic overlay renders the plurality of graphene members isotropic with respect to X, Y, and Z axes. In at least one embodiment, the plurality of graphene members are embedded in the metallic overlay.

The plurality of graphene members may be doped. For example, the plurality of graphene members may be doped with bromine.

The plurality of graphene members may be positioned on a dielectric substrate. Metal may be deposited over the plurality of graphene members to form the metallic overlay. For example, the metal may be deposited over the plurality of graphene members through sputtering, atomic layer deposition, chemical vapor deposition, and/or electrochemical deposition. The dielectric substrate may be formed of FR4 material, glass, a circuit board, and/or the like. The metallic overlay may be formed of copper, aluminum, gold, palladium, and/or silver, for example.

In at least one embodiment, at least one high-conductivity electrical interconnect is configured to be mixed into a printer ink.

Certain embodiments of the present disclosure provide a method of forming a high-conductivity electrical interconnect on a substrate. The method may include forming a graphene film with a plurality of graphene members, depositing a metal over the graphene film, and providing a metallic overlay that connects the plurality of graphene members together through the depositing operation to form a covered graphene film.

The providing operation may include connecting peripheral edges of the plurality of graphene members together. The providing operation may include rendering the plurality of graphene members conductively isotropic with respect to X, Y, and Z axes.

The method may also include doping the plurality of graphene members.

The method may include positioning the graphene film onto the substrate. The depositing operation may occur after the positioning operation. The depositing operation may include sputtering, atomic layer deposition, chemical vapor deposition, electrochemical deposition, and/or the like.

In at least one embodiment, the method may include mixing the covered graphene film and other covered graphene films in ink. The method may also include depositing the ink having the covered graphene films onto the substrate.

DETAILED DESCRIPTION OF THE DISCLOSURE

Figure 1:
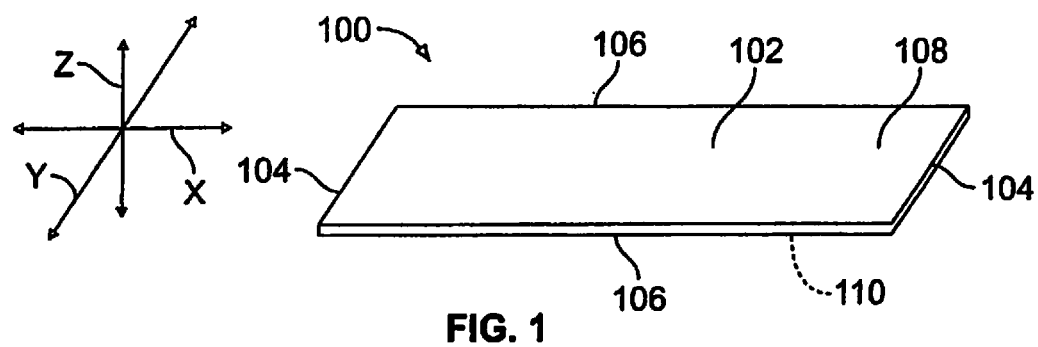
FIG. 1 is a diagrammatic representation of a perspective top view of a graphene member, according to an embodiment of the present disclosure.

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular condition may include additional elements not having that condition.

Embodiments of the present disclosure provide an electrical interconnect that may include graphene or graphite members (such as platelets, flakes, segments, or the like) embedded in a metallic matrix (such as a conductive metallic overlay). The metallic matrix may provide an overlay that is formed through physical or chemical processes. The electrical interconnect may be deposited, patterned, attached, or otherwise positioned on a printed circuit board (or other substrate having electrical interconnections) to provide reduced electrical resistance.

Certain embodiments of the present disclosure provide a method of forming ultra-high electrical conductivity lines on electrical substrates, such as circuit boards, glass panels, multichip modules, integrated circuits, flat panel displays, power boards, and the like. The method may include depositing brominated, graphene or graphite platelets that are deposited on a dielectric substrate. The graphene platelets are then electrically interconnected by a thin, metallic overlay, which may encapsulate or otherwise cover the graphene platelets. The metallic overlay may be formed of copper, silver, gold, palladium, or aluminum, for example. The metallic overlay may be deposited on and/or over the graphene platelets through chemical vapor deposition, sputtering, atomic layer deposition, chemical functionalization, and/or the like. The interconnecting layer and the graphene platelets form a highly conductive interconnect that exhibits a higher conductivity than copper, for example.

Certain embodiments of the present disclosure provide a method of providing an electrical interconnection on a dielectric substrate. The dielectric substrate may include FR4 material, glass, other circuit board materials, and/or the like. The electrical interconnection may include a plurality of bromine-doped graphene segments (such as platelets, layers, and/or the like) electrically interconnected by a thin film metallic overlay. The method may include doping graphene segments to provide high electrical conductivity pathways. The doping process may be through bromine intercalation, during which the bromine penetrates the graphene layers and chemically bonds to the graphene layers, further increasing the electrical conductivity of the graphene segments. A thin electrically conductive metallic film including aluminum, copper, gold, palladium, or silver electrically interconnects the graphene segments. The metallic overlay provides substantial conformal coverage of the platelets, particularly along the edges of the doped graphene members, and achieves a minimum or otherwise reduced interface electrical resistance between doped graphene members and the metallic overlay.

Certain embodiments of the present disclosure may provide a method of providing an electrical interconnection on a dielectric substrate that may include formulating a plurality of metal encapsulated doped graphene members. The encapsulation may include thin film methods such as sputtering, atomic layer deposition, chemical vapor deposition, electrochemical deposition or a combination thereof. The method may also include mixing the metal encapsulated, doped graphene members into a conductive ink (such as used in direct-write applications of electronic components and interconnects) and printing the traces on the dielectric substrate using the electrically conductive printer ink having the graphene members mixed therein.

Certain embodiments of the present disclosure provide a method of providing an electrical interconnection on a dielectric substrate that may include forming the doped graphene, and interconnecting all the doped graphene segments to each other using a metallic thin film overlay, in which the metallic thin film overlay may include aluminum, copper, gold, palladium, or silver. The metal material provides a low resistivity interface contact between the doped graphene segments and the metallic film on a substrate that can be used to transfer the highly conductive film onto another dielectric substrate, such as a circuit board or a multichip module. An electrical path is defined through the graphene segments and the thin electrically conductive metallic film that interlinks the graphene segments. The electrical path is substantially along the edges of the graphene segments. The electrical resistance along the edges is less than with respect to a normal direction to the planar surface of the graphene segments in contact with the overlaying thin electrically conductive metallic film.

In at least one embodiment, doped, graphene segments may be encapsulated or surrounded by an electrically conductive layer. The conductive layer may be a metallic layer such as silver, gold, copper, or aluminum, for example. The metallic encapsulating layer of doped graphene segments may include one or more layers, such that an inner metallic layer provides a low interface resistance interconnection to a doped graphene edge and an outer layer provides a low interface resistance contact to a metallic matrix that includes the encapsulated doped graphene segments.

FIG. 1 is a diagrammatic representation of a perspective top view of a graphene member 100, according to an embodiment of the present disclosure. The graphene member 100 may be a platelet, flake, segment, or other such body of graphene. The graphene member 100 may be in the form of a platelet, either as a fine powder or suspended in a liquid. The graphene member 100 may be a single layer of graphene. Optionally, a plurality of graphene members 100 may be or include multiple graphene pieces, such as 2-10 pieces of graphene.

Graphene is a layer of carbon. Graphene is a single layer of carbon atoms bonded together in a hexagonal honeycomb lattice. Graphene is an allotrope of carbon in the form of a two-dimensional, atomic-scale, hexagonal lattice in which one atom forms each vertex. Graphene efficiently conducts heat and electricity. Multiple graphene members, such as multiple graphene pieces, provide a plurality of single atomic layers of graphene.

Graphite may be exfoliated into platelets of 1-10 atomic layers (for example) to form graphene. Graphene has unique properties and is thus a material of its own. While graphene is conductive, it may also be doped to further increase electrical conductivity.

The graphene member 100 includes a main body 102 having peripheral end edges 104 and lateral edges 106 that connect to an upper surface 108 and a lower surface 110. The graphene member 100 is anisotropic in that conductivity in directions parallel to an X-Y plane is greater than conductivity in normal directions parallel to a Z-axis. The conductivity in directions parallel to the X-Y plane may be high, but the conductivity in directions parallel to the Z-axis may be negligible and/or substantially less than that in directions parallel to the X-Y plane.

The graphene member 100 may be doped. For example, the graphene member 100 may be doped through bromine intercalation. In at least one embodiment, multiple graphene members 100 may be positioned together (such as stacked together), and the graphene members 100 may be doped. During the doping process, bromine penetrates the graphene members 100 and chemically bonds thereto. In at least one other embodiment, the graphene member(s) 100 may be doped with various other elements. Alternatively, the graphene member 100 may not be doped.

As noted, graphene is an anisotropic material. The molecular bonding along the planes (for example, along the X-Y plane) as compared to the normal direction (directions parallel to the Z-axis) is different. Electrical conductivity $\sigma = e \cdot n \cdot \mu$, where e is the electronic charge, n is the number of free carriers, and $\mu$ is the mobility. Doping graphene increases the number of available carriers with a modest impact on mobility. However, the doping occurs along the planes (for example, along planes that are parallel to the X-Y plane). Because graphene doping takes place through intercalation (for example, the dopant atom or molecule inserts itself between the graphene planes), spacing between the graphene layers may increase, which may further lower the conductivity normal to the layers of graphene. As explained below, however, peripheral edge portions of graphene members 100 are interconnected by a metallic overlay, which increases the conductivity normal to the layers of graphene.

Figure 2:
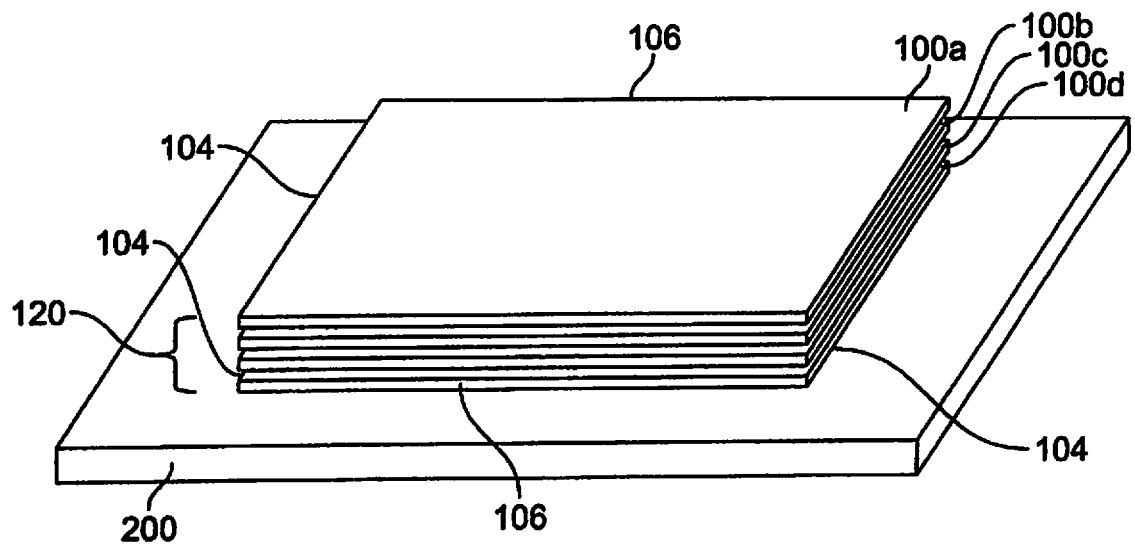
FIG. 2 is a diagrammatic representation of a perspective top view of graphene members stacked on a substrate, according to an embodiment of the present disclosure.

FIG. 2 is a diagrammatic representation of a perspective top view of graphene members 100a, 100b, 100c, and 100d stacked on a substrate 200, according to an embodiment of the present disclosure. The substrate 200 may be a dielectric substrate formed of FR4 material, glass, circuit board material, and/or the like.

In order to form a highly-conductive interconnect, the graphene members 100a-d may first be stacked onto the substrate 200. The graphene members 100a, 100b, 100c, and 100d may be stacked in various orientations. As shown in FIG. 2, the graphene members 100a-d may be stacked such that the end edges 104 and the lateral edges 106 may be vertically and/or horizontally aligned. Optionally, the graphene members 100a-d may be stacked such that the end edges 104 and the lateral edges 106 are not vertically or horizontally aligned. Additionally, while four graphene members 100a-d are shown, more or less graphene members may be used. Further, the graphene members 100a-d may be sized and shaped differently from one another. For example, the graphene member 100a may be sized and shaped differently than any of the other graphene members 100b-d. Optionally, the graphene members 100a-d may be sized and shaped the same.

The stacked graphene layers 100a-100d combine to form a graphene film 120. The graphene film 120 may have a thickness that may range from sub-micrometer thicknesses up to several tens of micrometers, for example.

Figure 3:
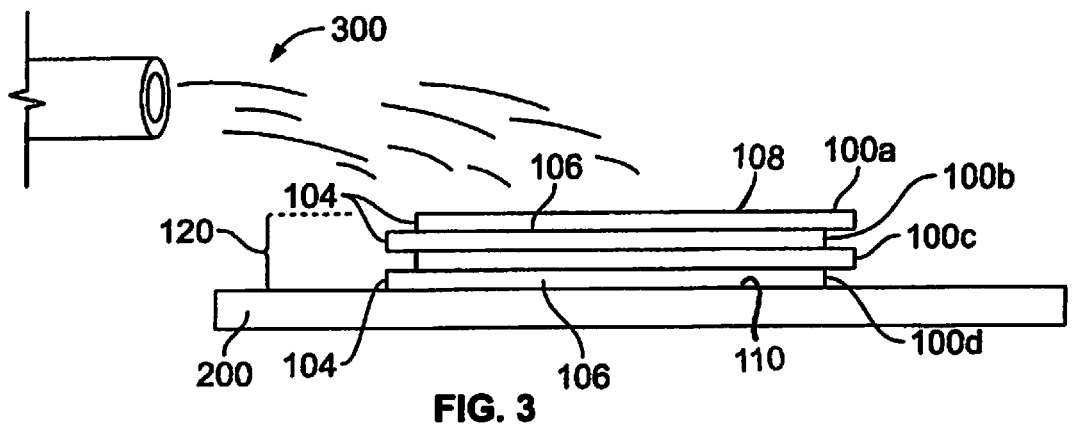
FIG. 3 is a diagrammatic representation of a lateral view of a metal being deposited over graphene members positioned on a substrate, according to an embodiment of the present disclosure.

FIG. 3 is a diagrammatic representation of a lateral view of a metal 300 being deposited over the graphene members 100a-d positioned on the substrate 200, according to an embodiment of the present disclosure. It is to be understood that the Figures are not drawn to scale. The substrate 200 may have a thicknesses that is much greater than the thicknesses of the graphene members 100a-d. The metal 300 may be copper, aluminum, gold, palladium, or silver, for example, and may be deposited onto the graphene members 100a-d through sputtering, atomic layer deposition, chemical vapor deposition, electrochemical deposition, and/or the like.

In order to form the highly-conductive interconnect, after the graphene members 100a-d are positioned on the substrate, the metal 300 is deposited over the graphene members 100a-d to form a metallic overlay. The metallic overlay covers the end edges 104 and the lateral edges 106 of each of the graphene members 100a-d, thereby interconnecting the end edges 104 and the lateral edges 106 of each of the graphene members 100a-d together. The metallic overlay may also cover the upper surfaces 108 and the lower surfaces 110 of at least some of the graphene members 100a-d. In at least one other embodiment, the metallic overlay may cover an upper surface 108 of one graphene member 100a-d, but not a lower surface 110 of at least one other graphene member 100a-d, or vice versa.

Figure 4:
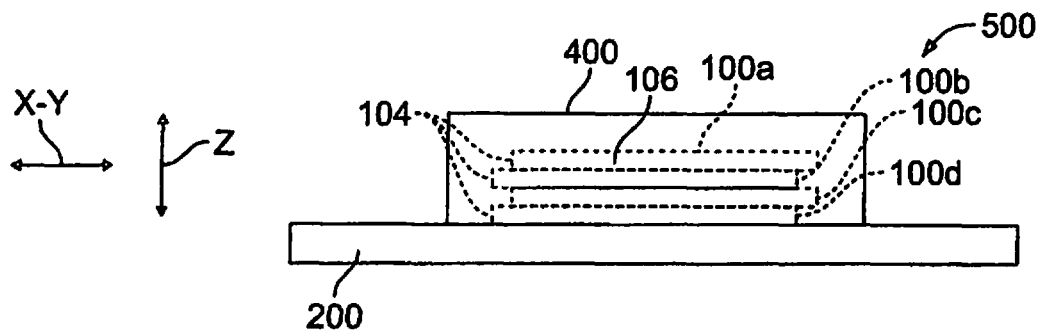
FIG. 4 is a diagrammatic representation of a lateral view of a metallic overlay encapsulating graphene members on a substrate, according to an embodiment of the present disclosure.

FIG. 4 is a diagrammatic representation of a lateral view of a metallic overlay 400 encapsulating the graphene members 100a-d on the substrate 200, according to an embodiment of the present disclosure. The metallic overlay 400 and the graphene members 100a-d combine to form a highly-conductive electrical interconnect 500. The graphene members 100a-d may be embedded in the metallic overlay 400. As noted above, the metallic overlay 400 is formed over the graphene members 100a-d by the metal 300 (shown in FIG. 3) being deposited onto the graphene members 100a-d. Because the metallic overlay 400 encapsulates the graphene members 100a-d, the outer peripheral end edges 104 and the lateral edges 106 of the graphene members 100a-d are interconnected together.

The doped graphene members 100a-d (such as doped with bromine, as noted above) are surrounded with the metallic overlay 400 (such as formed of copper, aluminum, gold, palladium, or silver), which provides a conductive matrix that interconnects the graphene members 100a-d together. Because the metallic overlay 400 is deposited over the graphene members 100a-d and interconnects the peripheral edges of the graphene members 100a-d, a minimal or otherwise reduced amount of metal 300 (as shown in FIG. 3) may be used. That is, the amount of metal 300 used may be sufficient to connect the peripheral edges of the graphene members 100a-d together. Additional metal 300 beyond the amount to connect the peripheral edges of the graphene members 100a-d together may also, or may not, be used. In short, the metallic overlay 400 may be of sufficient size and shape to interconnect the graphene members 100a-d together and provide electrical interconnection capability on a dielectric substrate.

It is to be understood that FIG. 4 is not drawn to scale. The metallic overlay 400 may not be as thick or thin in comparison to the graphene members 100a-d and the substrate 200. For example, the metallic overlay 400 may not cover a top surface of the graphene member 100a, but instead may only cover the end edges 104 and the lateral edges 106. Alternatively, the metallic overlay 400 may be sufficient to cover all graphene materials, and be as thick (or thicker) than the underlying graphene members. In at least one embodiment, a graphene member 100a-d may have a thickness of 3 angstroms. Alternatively, a graphene member 100a-d may have a thickness greater or less than 3 angstroms. The metallic overlay 400 may have a thickness of 100-300 angstroms, for example. Alternatively, the metallic overlay 400 may have a thickness of 1 to tens of micrometers, for example. In short, a total composite thickness of graphene members encapsulated in a metallic, conductive matrix may range from sub-micrometer ranges to tens of micrometers, in order to meet desired conductance specifications.

By interconnecting the peripheral end edges 104 and lateral edges 106 to the upper and lower surfaces 110 of the graphene members 100a-d together, the metallic overlay effectively makes the stacked graphene members 100a-d conductively isotropic, such that the conductivity of the electrical interconnect 500 is uniform in directions parallel to the X-Y plane and in directions parallel to the Z axis. The graphene members 100a-d are connected edge-wise to one another through the metallic overlay 400, which provides an interconnecting matrix between the graphene members 100a-d.

Referring to FIGS. 1-4, the highly-conductive electrical interconnect 500 is formed by first positioning a plurality of graphene members 100 onto the substrate 200. The graphene members 100 may be individually or collectively doped. The metal 300 is deposited over the graphene members 100 such that the metal 300 interconnects the peripheral edges 104 and 106 of the graphene members 100 together, thereby forming the metallic overlay 400. The metallic overlay 400 may fill gaps, interstices, openings, channels, and/or the like between peripheral edges 104 and 106 of the graphene members 100. In at least one embodiment, the graphene members 100a-d may be individually or collectively encased in a thin metallic layer that electrically connects edges 104, 106 and surfaces 108, 110.

In contrast to graphite, the graphene members 100 are thinner and more robust. The graphene members 100 are less susceptible to cracking or breaking, as compared to graphite. As such, the process of doping the graphene members 100 is effective and efficient. In short, because the graphene members 100 are thinner and more robust than graphite, the graphene members 100 may be formed with less defects and at a lower cost as compared to graphite.

As shown in FIGS. 2-4, the graphene members 100a-d are stacked. As such, the metal 300 may or may not be deposited between planar surfaces (such as the upper and lower surfaces 108 and 110) of adjacent graphene members 100a-d. The metallic overlay 400 may not extend between the planar surfaces of adjacent graphene members 100a-d, but may contact the exposed peripheral edges 104 and 106 of the graphene members, thereby effectively interconnecting the graphene members 100a-d together, and consequently increasing the conductive nature of the electrical interconnect 500, while at the same time, minimizing or otherwise reducing a total amount of the metal 300 that is used to form the metallic overlay 400. In short, the graphene members 100a-d may be interconnected in an edge-wise manner by the metallic overlay 400 with some or no metallic material between planar surfaces 108 and 110 of adjacent graphene members 100a-d.

Figure 5:
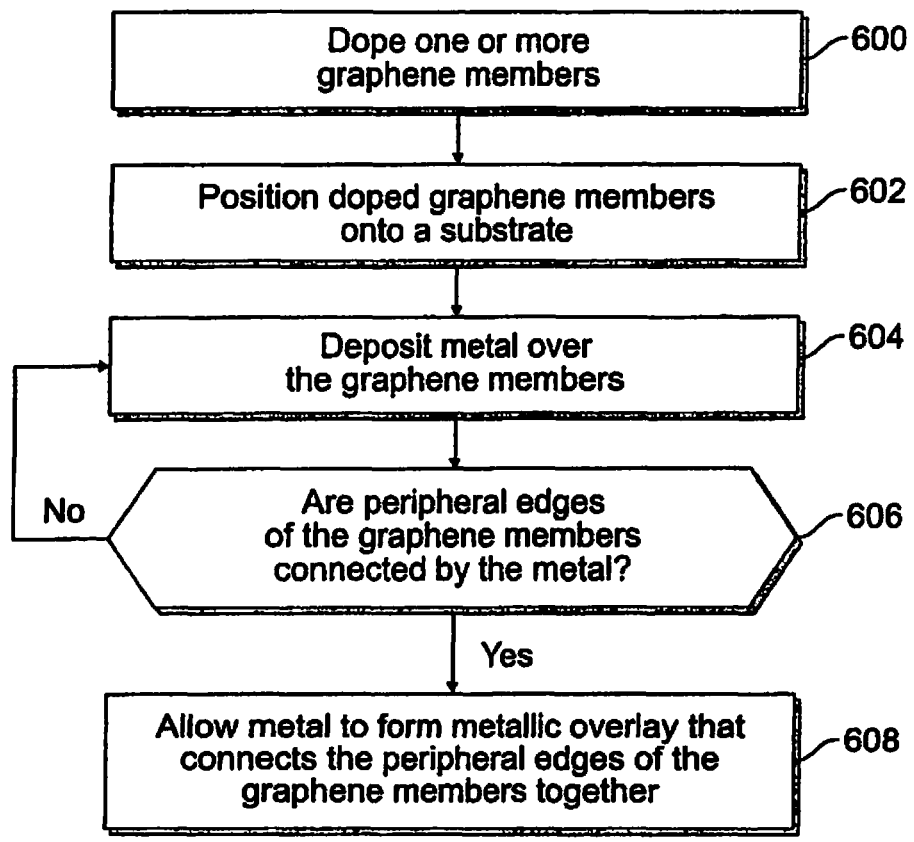
FIG. 5 illustrates a flow chart of a method of forming a highly-conductive electrical interconnect, according to an embodiment of the present disclosure.

FIG. 5 illustrates a flow chart of a method of forming a highly-conductive electrical interconnect, according to an embodiment of the present disclosure. The method begins at 600, in which one or more graphene members are doped, such as with bromine. The graphene members may be individually or collectively doped. Alternatively, the graphene members may not be doped.

At 602, the doped graphene members are positioned onto a substrate. At 604, a metal (such as copper, aluminum, or silver) is deposited over the graphene members, such as through sputtering, atomic layer deposition, chemical vapor deposition, electrochemical deposition, and/or the like. The graphene members may be individually or collectively encapsulated in the ensuing metallic matrix.

At 606, it is determined whether the peripheral edges of the graphene members are connected by the deposited metal. If the peripheral edges of the graphene members are not connected together by the metal, the method returns to 604. If, however, the peripheral edges of the graphene members are connected by the deposited metal, the method proceeds from 606 to 608, in which the metal is allowed to form a metallic overlay that connects the peripheral edges of the graphene members together.

Figure 6:
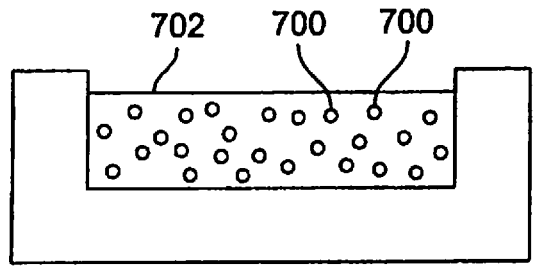
FIG. 6 is a diagrammatic representation of a simplified view of a plurality of encapsulated graphene films mixed into printer ink, according to an embodiment of the present disclosure.

FIG. 6 is a diagrammatic representation of a simplified view of a plurality of encapsulated or otherwise covered graphene films 700 mixed into printer ink 702, according to an embodiment of the present disclosure. Each graphene film 700 includes a plurality of graphene members (such as the graphene member 100) encapsulated by a metallic overlay (such as the metallic over 400). The encapsulated graphene films 700 are mixed into the ink 702. The ink 702 allows for the encapsulated graphene films 700 to be transferred onto a dielectric substrate, such as a circuit board or any other surface that provides a substrate for electrical interconnections or patterns.

Figure 7:
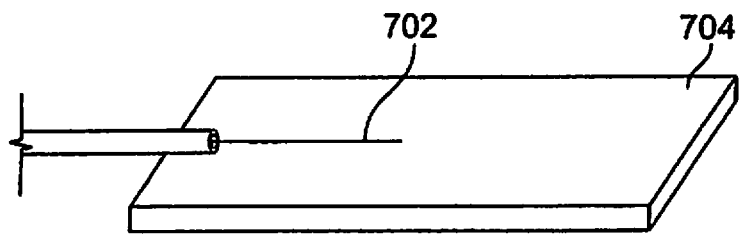
FIG. 7 is a diagrammatic representation of a simplified view of a printer ink having a plurality of encapsulated graphene films deposited onto a substrate, according to an embodiment of the present disclosure.

FIG. 7 is a diagrammatic representation of a simplified view of the printer ink 702 having the plurality of encapsulated graphene films 700 deposited onto a substrate 704, according to an embodiment of the present disclosure. Referring to FIGS. 6 and 7, the graphene films 700 are formed as described above. Namely, the graphene films 700 include a plurality of graphene members, which may be doped, and encapsulated by a metallic overlay. The graphene films 700 are then mixed into printer ink (such as a direct-write and/or 3D printer ink).

Figure 8:
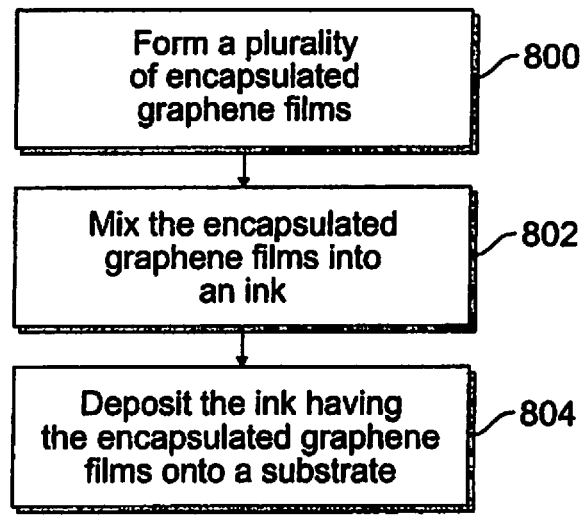
FIG. 8 illustrates a flow chart of a method of forming a highly-conductive electrical segment on a substrate, according to an embodiment of the present disclosure.

FIG. 8 illustrates a flow chart of a method of forming a highly-conductive electrical segment on a substrate, according to an embodiment of the present disclosure. At 800, a plurality of encapsulated graphene films are formed. At 802, the encapsulated graphene films are mixed into an ink, such as a 3D printer ink. At 804, the ink having the encapsulated graphene films are deposited onto a substrate to form the electrical segment.

In at least one other embodiment, the encapsulated graphene films may be mixed with a binding agent. The binding agent having the encapsulated graphene films may then be sprayed onto the surface of a dielectric layer to render it electrically conductive.

Figure 9:
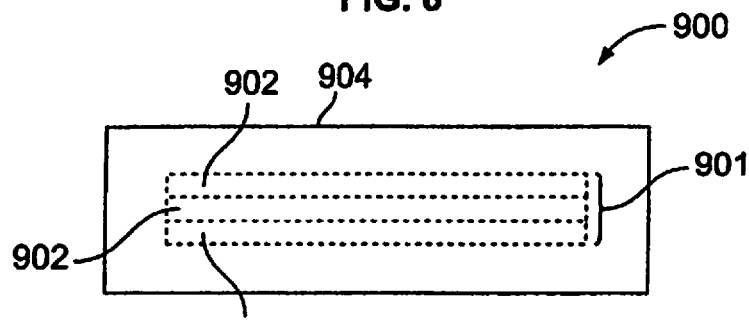
FIG. 9 is a diagrammatic representation of a lateral view of a graphene film, according to an embodiment of the present disclosure.

FIG. 9 is a diagrammatic representation of a lateral view of a covered graphene film 900, according to an embodiment of the present disclosure. The covered graphene film 900 includes a plurality of graphene members 902 (that collectively form the graphene film 901) encapsulated in a metallic overlay 904.

Referring to FIGS. 1-9, embodiments of the present disclosure provide highly-conductive electrical interconnects, which may be formed by connecting doped graphene members with a metallic overlay. The metallic overlay may interconnect peripheral edges of the graphene members together. The electrical interconnects may be used to provide ultra-high electrical conductivity lines on substrates, such as circuit boards, multichip modules, flat panel displays, power boards, and the like. It has been found that the conductivity of each electrical interconnect exceeds that of copper, for example.

Accordingly, embodiments of the present disclosure provide systems and methods of efficiently and effectively forming a highly-conductive structure. Embodiments of the present disclosure provide interconnects that may provide increased conductivity to an electrical component.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. An electrical interconnect configured to electrically interconnect electrical components,
wherein the electrical interconnect is mixed into a printer ink,
the electrical interconnect comprising:
a plurality of bromine-doped graphene members; and
a metallic overlay connecting the plurality of bromine-doped graphene members together,
wherein the metallic overlay is over and around the plurality of bromine-doped graphene members,
wherein the metallic overlay renders the plurality of bromine-doped graphene members conductively isotropic with respect to X, Y, and Z axes.

2. The electrical interconnect of claim 1, wherein the metallic overlay connects peripheral edges of the plurality of bromine-doped graphene members together.

3. The electrical interconnect of claim 1, wherein the plurality of bromine-doped graphene members are embedded in the metallic overlay.

4. The electrical interconnect of claim 1,
wherein the plurality of bromine-doped graphene members are positioned on a dielectric substrate,
and wherein metal is deposited over the plurality of bromine-doped graphene members to form the metallic overlay.

5. The electrical interconnect of claim 4, wherein the metal is deposited over the plurality of bromine-doped graphene members through one or more of sputtering, atomic layer deposition, chemical vapor deposition, or electrochemical deposition.

6. The electrical interconnect of claim 4, wherein the dielectric substrate is formed of one or more of FR4 material, glass, or a circuit board.

7. The electrical interconnect of claim 1, wherein the metallic overlay is formed of one or more of copper, aluminum, gold, palladium, or silver.

8. The electrical interconnect of claim 1, wherein the metallic overlay is distinct from the plurality of bromine-doped graphene members.

9. The electrical interconnect of claim 1, wherein the metallic overlay does not include the plurality of bromine-doped graphene members.

10. The electrical interconnect of claim 1, wherein none of the plurality of bromine-doped graphene members is intermixed with any portion of the metallic overlay.

11. A method of forming an electrical interconnect on a substrate,
wherein the electrical interconnect is mixed into a printer ink,
the method comprising:
providing a plurality of bromine-doped graphene members; and
connecting the plurality of bromine-doped graphene members together with a metallic overlay,
wherein the connecting operation comprises rendering the plurality of bromine-doped graphene members conductively isotropic with respect to X, Y, and Z axes,
wherein the metallic overlay is over and around the plurality of bromine-doped graphene members.

12. The method of claim 11, wherein the connecting operation comprises connecting peripheral edges of the plurality of bromine-doped graphene members together.

13. The method of claim 11, further comprising positioning a graphene film formed by the plurality of bromine-doped graphene members onto the substrate, and wherein the connecting operation occurs after the positioning operation.

14. The method of claim 11, wherein the connecting operation comprises depositing a metal over the graphene film to form a covered graphene film that includes the metallic overlay, wherein the depositing includes one or more of sputtering, atomic layer deposition, chemical vapor deposition, or electrochemical deposition.

15. The method of claim 14, further comprising:

mixing the covered graphene film and other covered graphene films in ink; and depositing the ink having the covered graphene films onto the substrate.

16. The method of claim 11, wherein the metallic overlay is distinct from the plurality of bromine-doped graphene members.

17. The method of claim 11, wherein the metallic overlay does not include the plurality of bromine-doped graphene members.

18. The method of claim 11, wherein none of the plurality of bromine-doped graphene members is intermixed with any portion of the metallic overlay.

19. An electrical interconnect configured to electrically interconnect electrical components, wherein the electrical interconnect is mixed into a printer ink, the electrical interconnect comprising:

a plurality of bromine-doped graphene members, wherein the plurality of bromine-doped graphene members are positioned on a dielectric substrate; and a metallic overlay connecting the plurality of bromine-doped graphene members together, wherein the metallic overlay connects peripheral edges of the plurality of bromine-doped graphene members together, wherein the metallic overlay renders the plurality of bromine-doped graphene members conductively isotropic with respect to X, Y, and Z axes, wherein the metallic overlay is over and around the plurality of bromine-doped graphene members.

20. The electrical interconnect of claim 19, wherein metal is deposited over the plurality of bromine-doped graphene members to form the metallic overlay, and wherein the metal is deposited over the plurality of bromine-doped graphene members through one or more of sputtering, atomic layer deposition, chemical vapor deposition, or electrochemical deposition.

21. The electrical interconnect of claim 19, wherein the metallic overlay is distinct from the plurality of bromine-doped graphene members.

22. The electrical interconnect of claim 19, wherein the metallic overlay does not include the plurality of bromine-doped graphene members.

23. The electrical interconnect of claim 19, wherein none of the plurality of bromine-doped graphene members is intermixed with any portion of the metallic overlay.

* * * * *